(12) United States Patent
Ibarra et al.

(10) Patent No.: US 7,249,028 B2
(45) Date of Patent: Jul. 24, 2007

(54) MANUFACTURING LABOR COST ESTIMATOR

(75) Inventors: Juan J. Ibarra, Pittsburgh, PA (US); Edgar G. Hernandez, Cranberry Township, PA (US); Anderson Dela Torre, Wexford, PA (US)

(73) Assignee: Ericsson AB, Stockholm (SE)

( * ) Notice: Subject to any disclaimer, the term of this patent is extended or adjusted under 35 U.S.C. 154(b) by 966 days.

(21) Appl. No.: 09/847,609

(22) Filed: May 1, 2001

(65) Prior Publication Data

US 2003/0023449 A1 Jan. 30, 2003

(51) Int. Cl.
*G06Q 10/00* (2006.01)

(52) U.S. Cl. .............................. 705/1; 705/8
(58) Field of Classification Search ...... None
See application file for complete search history.

(56) References Cited

U.S. PATENT DOCUMENTS

| | | | | |
|---|---|---|---|---|
| 5,249,120 A | * | 9/1993 | Foley | 705/1 |
| 5,278,751 A | * | 1/1994 | Adiano et al. | 705/10 |
| 5,546,564 A | * | 8/1996 | Horie | 703/1 |
| 5,793,632 A | * | 8/1998 | Fad et al. | 705/400 |
| 5,893,082 A | * | 4/1999 | McCormick | 705/400 |
| 5,960,417 A | * | 9/1999 | Pan et al. | 705/400 |
| 6,037,945 A | * | 3/2000 | Loveland | 345/420 |
| 6,073,107 A | * | 6/2000 | Minkiewicz et al. | 705/7 |
| 6,219,654 B1 | * | 4/2001 | Ruffin | 705/400 |
| 6,249,776 B1 | * | 6/2001 | Bajuk et al. | 705/400 |
| 6,343,285 B1 | * | 1/2002 | Tanaka et al. | 705/400 |
| 6,775,647 B1 | * | 8/2004 | Evans et al. | 703/7 |
| 6,898,580 B1 | * | 5/2005 | Curran et al. | 705/400 |
| 7,020,621 B1 | * | 3/2006 | Feria et al. | 705/10 |

FOREIGN PATENT DOCUMENTS

DE 3743163 A1 * 6/1989

* cited by examiner

*Primary Examiner*—John G. Weiss
*Assistant Examiner*—Michael Fisher
(74) *Attorney, Agent, or Firm*—Ansel M. Schwartz

(57) ABSTRACT

A method, apparatus and code product for estimating labor costs associated with producing a printed circuit board assembly.

8 Claims, 2 Drawing Sheets

MANUFACTURING LABOR COST ESTIMATOR

FIELD OF THE INVENTION

The present invention is related to estimating the labor cost associated with manufacturing a printed circuit board assembly. More specifically, the present invention is related to estimating the labor cost associated with manufacturing a printed circuit board assembly as a function of annual volume for the printed circuit board assembly, and a breakdown of the percentage of surface mount technology components versus other technology components and other mechanical operations required to manufacture the assembly.

BACKGROUND OF THE INVENTION

Software solutions in the marketplace for estimating the manufacturing labor portion of printed circuit board assembly manufacturing currently focus on the cost of materials, which average 80-85% of the total cost of the product. The remaining 15-20% of the cost is the labor portion associated with manufacturing, testing and other items required to convert the product from a collection of raw materials to a printed circuit board assembly.

Because no commercial solutions exist for analyzing the labor component of the manufacture of printed circuit board assemblies, the labor component of the overall cost of a printed circuit board assembly is analyzed by:
- Comparing the quotation on a particular printed circuit board assembly to a similar assembly previously manufactured by the same supplier,
- Experience in the manufacturing process and understanding the labor steps associated with the particular product and/or
- No analysis; simply accepting the conversion cost (cost of labor) provided by the supplier.

The present invention eliminates the need for comparison, extensive manufacturing expertise and/or heavy dependence on the information provided by the supplier. The present invention, otherwise known as the Manufacturing Labor Cost Estimator, is a first of a kind software tool specifically targeted at the analysis of labor costs of manufacturing printed circuit board assemblies. It is difficult to quantify the cost savings associated with the use of Manufacturing Labor Cost Estimator as past labor costs have been negotiated using empirical data and educated hypothesis.

SUMMARY OF THE INVENTION

The present invention pertains to a method for estimating labor costs associated with producing a printed circuit board assembly. The method comprises the steps of projecting volume for a predetermined period of time for the printed circuit board assembly. There is the step of calculating a cost of conversion at a predetermined percentage of surface mount technology components of the printed circuit board assembly. There is the step of generating a cost of conversion for the printed circuit board assembly based on actual percentage of surface mount technology components of the printed circuit board assembly from the cost of conversion at the predetermined percentage.

The present invention pertains to a method for building a printed circuit board assembly. The method comprises the steps of estimating labor costs associated with producing the printed circuit board assembly with a computer, as a function of volume of the printed circuit board assembly produced per unit time and percentage of surface mount technology components of the printed circuit board. There is the step of producing the printed circuit board assembly.

The present invention pertains to an apparatus for estimating labor costs associated with producing a printed circuit board assembly. The apparatus comprises a computer having means for estimating costs associated with a labor portion of manufacturing the printed circuit board assembly. The apparatus comprises an input device for inputting information for estimating the costs into the computer.

The present invention pertains to a computer program product for enabling a processor in a computer to estimate costs associated with producing a printed circuit board assembly. The computer program product comprises a computer readable program code means for enabling the computer to estimate costs with a labor portion of manufacturing the printed circuit board assembly.

BRIEF DESCRIPTION OF THE DRAWINGS

In the accompanying drawings, the preferred embodiment of the invention and preferred methods of practicing the invention are illustrated in which.

DETAILED DESCRIPTION

Figure 1:
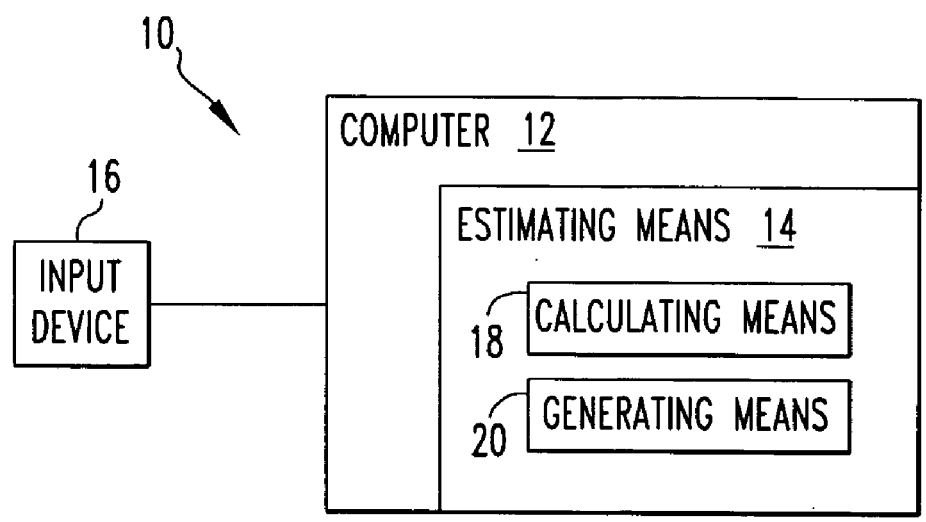
FIG. 1 is a block diagram of an apparatus of the present invention.
Figure 2:
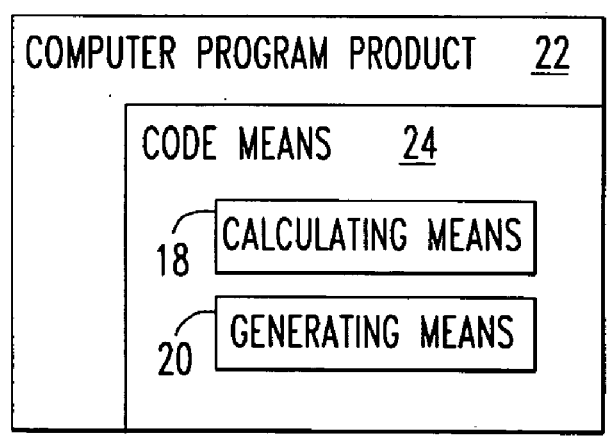
FIG. 2 is a block diagram of a computer program product of the present invention.

Referring now to the drawings wherein like reference numerals refer to similar or identical parts throughout the several views, and more specifically to FIG. 1 thereof, there is shown an apparatus 10 for estimating labor costs associated with producing a printed circuit board assembly. The apparatus 10 comprises a computer 12 having means 14 for estimating costs associated with a labor portion of manufacturing the printed circuit board assembly. The apparatus 10 comprises an input device 16 for inputting information for estimating the costs into the computer 12.

Preferably, the estimating means 14 includes means 18 for calculating a cost of conversion at a predetermined percentage of surface mount technology components of the printed circuit board assembly. The estimating means 14 preferably includes means 20 for generating a cost of conversion for the printed circuit board assembly based on actual percentage of surface mount technology components of the printed circuit board assembly from the cost of conversion at the predetermined percentage.

Preferably, the predetermined percentage is 90% and the calculating means 18 calculates the cost of conversion at the predetermined percentage based on $$\text{Cost of Conversion} = 1.4392 * \text{volume}^{-0.3920}$$

where volume is a projected annual volume for the printed circuit board assembly. The generating means 20 preferably generates the cost of conversion for the printed circuit board assembly based on $$\$CPPx = \$CPP90 - \left[\$CPP90\left[\frac{SMT\ \%}{90} - 1\right]\right]$$

Where:
$CPP90 is the cost of conversion at 90% SMT components derived from Equation 1 and
SMT % is the actual percentage of SMT components for a particular PCBA, entered as a regular number (87 for 87%, not 0.87)
$CPPX is the cost of conversion at X % SMT components The present invention pertains to a method for estimating labor costs associated with producing a printed circuit board assembly. The method comprises the steps of projecting volume for a predetermined period of time for the printed circuit board assembly. There is the step of calculating a cost of conversion at a predetermined percentage of surface mount technology components of the printed circuit board assembly. There is the step of generating a cost of conversion for the printed circuit board assembly based on actual percentage of surface mount technology components of the printed circuit board assembly from the cost of conversion at the predetermined percentage.

Preferably, the predetermined percentage is 90% and the calculating step includes the step of inputting the projected annual volume for the printed circuit board assembly into $$\text{Costof Conversion} = 1.4392 * \text{volume}^{-0.3920}.$$

The generating step preferably includes the step of inserting the actual percentage of surface mount technology components of the printed circuit board assembly and the cost of conversion at the predetermined percentage into $$\$CPPx = \$CPP90 - \left[\$CPP90\left[\frac{SMT\ \%}{90} - 1\right]\right]$$

Where:
$CPP90 is the cost of conversion at 90% SMT components derived from Equation 1 and
SMT % is the actual percentage of SMT components for a particular PCBA, entered as a regular number (87 for 87%, not 0.87)
$CPPX is the cost of conversion at X % SMT components The present invention pertains to a method for building a printed circuit board assembly. The method comprises the steps of estimating labor costs associated with producing the printed circuit board assembly with a computer 12 as a function of volume of the printed circuit board assembly produced per unit time and percentage of surface mount technology components of the printed circuit board. There is the step of producing the printed circuit board assembly.

The present invention pertains to a computer program product 22 for enabling a processor 15 in a computer 12 to estimate costs associated with producing a printed circuit board assembly. The computer program product 22 comprises a computer 12 readable program code means 24 for enabling the computer 12 to estimate costs with a labor portion of manufacturing the printed circuit board assembly.

Preferably, the code means 24 includes means 18 for calculating a cost of conversion at a predetermined percentage of surface mount technology components of the printed circuit board assembly. Preferably, the code means 24 includes means 20 for generating a cost of conversion for the printed circuit board assembly based on actual percentage of surface mount technology components of the printed circuit board assembly from the cost of conversion at the predetermined percentage. The code means 24 and the estimating means 14, in one embodiment, can be the same.

The predetermined percentage is preferably 90% and the calculating means 18 calculates the cost of conversion at the predetermined percentage based on $$\text{Costof Conversion} = 1.4392 * \text{volume}^{-0.3920}$$

where volume is a projected annual volume for the printed circuit board assembly. Preferably, the generating means 20 generates the cost of conversion for the printed circuit board assembly based on $$\$CPPx = \$CPP90 - \left[\$CPP90\left[\frac{SMT\ \%}{90} - 1\right]\right]$$

Where:
$CPP90 is the cost of conversion at 90% SMT components derived from Equation 1 and
SMT % is the actual percentage of SMT components for a particular PCBA, entered as a regular number (87 for 87%, not 0.87)
$CPPX is the cost of conversion at X % SMT components In the operation of the invention, the fundamental premise of the Manufacturing Labor Cost Estimator is a statistical analysis of both internal and market historical Printed Circuit Board Assembly (PCBA) data. The key elements of this data are:
The annual volume for a particular PCBA,
The number of components on the bill of materials,
The percentage of surface mount technology (SMT) components and
The unit price or the labor costs associated with assembling the number of components.

Once collected, any number of regression analyses are possible to identify the cost impact associated with variability of any of the first three key elements within the data. The Manufacturing Labor Cost Estimator is based on the following two relationships:
The effect of annual volume on cost of conversion or cost per placement and
The effect of the percentage of SMT components versus other technologies and operations on the cost of conversion The most common form of PCBA being manufactured today contains approximately 90% SMT components and 10% other components and operations. Internal and market research data collections were focused on obtaining a large number of PCBAs that met these criteria.

For the purposes of generating a representative equation for the 90-10 PCBA volumes to cost of conversion relationship, 268 PCBAs (90% SMT components, 10% other) were plotted and analyzed. A regression analysis was performed on the data to arrive at an equation that represented this relationship. The exponential decay equation that resulted is:

$$\text{Costof Conversion} = 1.4392 * \text{volume}^{-0.3920} \qquad \text{Equation 1}$$

The output of this equation shows that the cost of conversion decreases as annual volume increases. The resultant cost of conversion graph was placed on the data set to confirm an acceptable correlation. Although other forms of regression analysis are available:

The exponential decay equation provides a line that is the best fit within all points of data utilized while not excessively compensating for outlying points.

Other types of regression analysis may track better against the historical data but would not be as beneficial for use in the model as they compensate excessively for outlying data points.

This equation is unique to the base set of historical data. New data, matching the specific criteria (90% SMT, 10% other components and operations) may be added to update the database and revise Equation 1 to account for the latest labor costs.

The next step was to generate a relationship to understand the cost of conversion as a function of the percentage of SMT components. Virtually all SMT components are placed by machines on the manufacturing line therefore are not the major cost drivers in the PCBA manufacturing process. Thus, cost of conversion is driven by other types of components (pin through hole), and other operations (e.g. assembly, test operations, etc.). By understanding the cost impact of SMT component assembly, the cost impact of other types of component assembly and operations will also be known.

Taking the output of Equation 1, the cost of conversion of a PCBA with 90% SMT components and 10% other components and operations and with an annual volume of X is known. From this a piecewise linear relationship can be developed to determine varying costs as a result of changes to the percentage of SMT components on a given PCBA. The piecewise linear curve can be developed using the known 90% cost of conversion by the following simple ratio calculation:

$$\$CPPx = \$CPP90 - \left[\$CPP90\left[\frac{SMT\ \%}{90} - 1\right]\right] \quad \text{Equation 2}$$

Where:

$CPP90 is the cost of conversion at 90% SMT components derived from Equation 1 and SMT % is the actual percentage of SMT components for a particular PCBA, entered as a regular number (87 for 87%, not 0.87)

$CPPX is the cost of conversion at X % SMT components

By combining the results of Equations 1 and 2, an estimate of the cost of conversion as a function of annual volume and percentage of SMT components may be derived.

Figure 3:
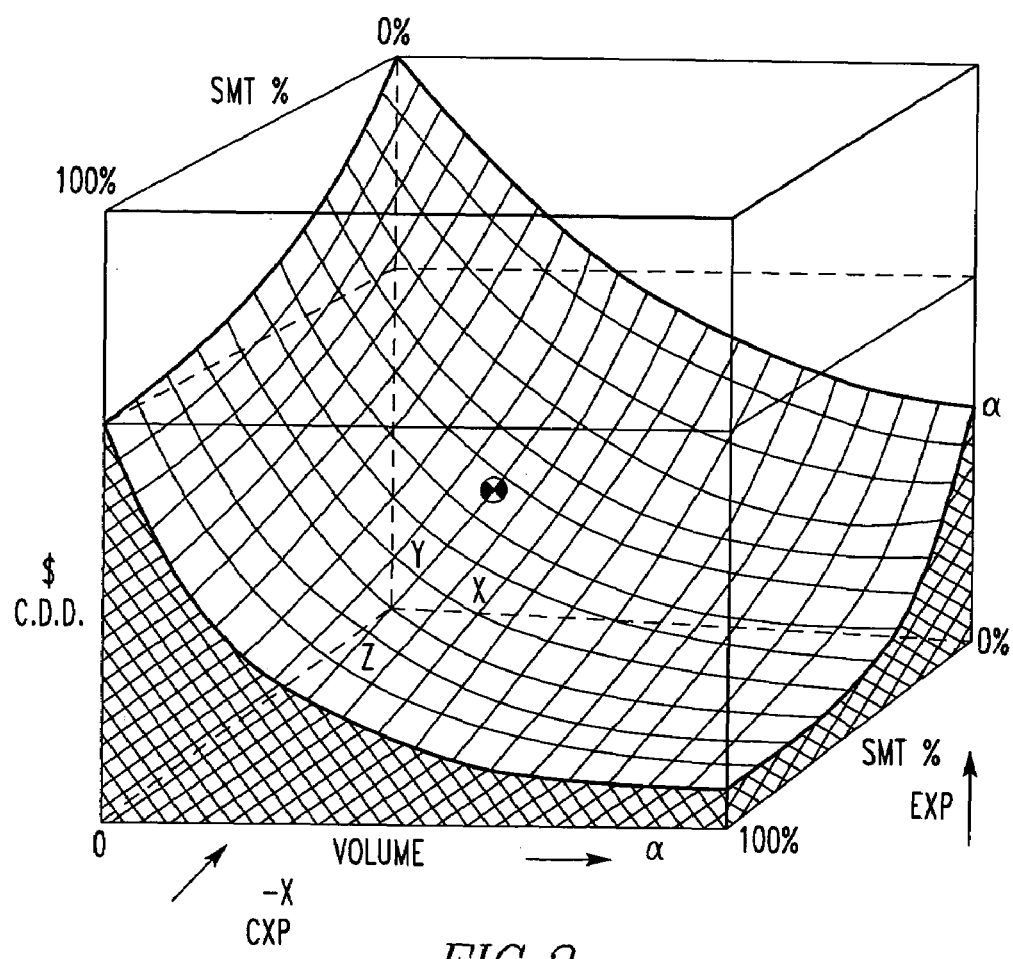
FIG. 3 is a chart showing the resulting three-dimensional surface area from compiling printed circuit board assembly data.

FIG. 3 depicts the three-dimensional surface area that results from compiling printed circuit board assembly data. On the X-axis of FIG. 3 is the relationship between volume and cost of conversion (cost of labor or cost per placement) as depicted on the Y-axis. The exponential decay on the X-axis is modeled via Equation 1. On the Z-axis of FIG. 3 is the relationship between SMT percentage and cost of conversion as depicted on the Y-axis. The piecewise linear decay on the Z-axis is modeled via Equation 2.

In summary, to obtain a cost of conversion for a specific PCBA, two pieces of information are required:

Projected annual volume for the PCBA. This number is input into Equation 1 to calculate the cost of conversion at 90% SMT components.

Percentage of SMT components. This number is input into Equation 2 with the cost of conversion that resulted from Equation 1 to generate a cost of conversion based on the SMT percentage of the specific PCBA.

The output of the Manufacturing Labor Cost Estimator was compared against actual historical internal and market research data to arrive at a confidence level. The data consisted of a variety of annual volumes and SMT percentages. For a range of SMT percentages of 98%-40% the resultant conversion costs from the model correlate to the actual data within 90%±2%.

It is important to remember that the key to this is the exponential decay, Equation 1 and that Equation 1 is based on historical data. In order to improve the correlation between the results of the data and the actual data, the historical database must be updated with new data on a regular basis and Equation 1 must be recalculated.

Next steps include applying this methodology of estimating labor costs to other internal processes. This methodology can be applied across numerous processes where there are standard manufacturing steps that are easily quantifiable in terms of types of technology. Simply put, this methodology provides a means to estimate the labor costs associated with automated and manual processes required to manufacture a product.

Examples of other possible applications for the Manufacturing Labor Cost Estimator may include manufacture of mobile phones, calculators, household appliances and automobiles. In each instance there is a significant portion of the labor that is constantly automated. It is also possible to easily identify those components on the bill of materials that are assembled by machine versus those that require manual assembly operations. Consistent with printed circuit board assembly manufacturing, the automated portion of the labor is not the cost driver: the manual portion and other operations are the cost drivers. A database can be created from historical labor cost data for each of these products and analyzed in a similar fashion as was done for the manufacture of printed circuit board assemblies to arrive at an automated method for estimating cost of conversion.

Currently, there is not automated method to obtain an estimate of what the labor portion of a PCBA may be prior to obtaining a quotation from a manufacturer. The labor component is scrutinized only AFTER receipt of the quotation. Review of the labor component may include:

Analyzing the time associated with the major steps in the PCBA assembly process, Comparing the labor cost quotation against historical data and Leveraging on past manufacturing experience to negotiate the labor costs.

This approach is based upon starting at the quotation for labor costs provided by the manufacturer not by the OEM. The Manufacturing Labor Cost Estimator provides a competitive advantage by:

Allowing an analysis of the labor cost prior to requesting a quotation for manufacture of the PCBA, Providing an estimate of the labor costs that is 90% accurate and based on historical data.

Providing the negotiating team with a piece of information that is based on internal and market data rather than ONLY the manufacturer's result.

EXAMPLE ANALYSIS

Following is a table of sample data used to create an exponential relationship between annual volume and cost of conversion:

| Number of Components | % SMT | Labor to assemble # of Components | Annual Volume |
| --- | --- | --- | --- |
| 1008 | 90% | $0.241 | 240 |
| 274 | 90% | $1.026 | 60 |
| 499 | 90% | $0.273 | 60 |
| 305 | 90% | $0.249 | 72 |
| 118 | 90% | $0.265 | 580 |
| 118 | 90% | $0.265 | 580 |
| 899 | 90% | $0.089 | 570 |
| 730 | 90% | $0.118 | 1,520 |
| 887 | 90% | $0.088 | 570 |

Labor to assemble the number of components can be easily determined. By knowing the material markup percentage, the total bill of materials cost and the materials markup can be subtracted from the unit price to identify the labor to assemble the components.

This data can then be plotted (using Excel or a similar data analysis tool) and further analyzed. A trend analysis of the data can then be performed to return the exponential decay equation that relates annual volume to cost of conversion. For this example, assume the resultant equation is the same as Equation 1 from above.

Given the following PCBA data, calculate the cost of conversion:

Annual Volume: 1750
% SMT: 82%

Input the Annual Volume into Equation 1 to return the value of cost of conversion for this specific PCBA at 90% SMT=$0.077064 which is $CPP90.

By inputting $CPP90 and SMT %=82 into equation 2 the resultant $CPP82=$0.083914

Items worth noting:
The fundamental relationship between annual volume and cost of conversion is that as annual volume increases, cost of conversion decreases as represented by Equation 1.
The fundamental relationship between SMT % and cost of conversion is that as the percentage of SMT components increases, the cost of conversion decreases as represented by Equation 2.
In Equation 2, it can be seen that when the SMT % is equal to 90%, the normalizing term is equal to 0 and the cost of conversion is the value provided solely by Equation 1. If the SMT % is greater than 90%, the actual cost of conversion ($CPPx) is the difference between $CPP90 and the normalizing term. If the SMT % is less than 90%, the actual cost of conversion ($CPPx) is the sum of $CPP90 and the normalizing term (in this instance the normalizing term results in a negative number and subtraction of a negative number results in addition of that number).

The Manufacturing Labor Cost Estimator is used to provide an estimate with a high confidence of accuracy, of the labor costs associated with the manufacture of a printed circuit board assembly. The basis of its development is the compilation of historical labor costs over a wide range of printed circuit board assemblies. Following are the essential components of the Manufacturing Labor Cost Estimator:

Manufacturing labor costs are generated by requiring the user to input the annual volume associated with a specific printed circuit board assembly and a breakdown of the percentage of surface mount technology components versus other technology components and other mechanical operations required to manufacture the assembly.

The Manufacturing Labor Cost Estimator then calculates an estimated labor cost by incorporating these two variables into three-dimensional exponential decay regression analyses. Data for the third dimension, conversion cost, was developed by compiling and incorporating historical conversion costs, varying component technologies and labor costs. The calculated result is based on historical data regarding research.

The novelty of the Manufacturing Labor Cost Estimator is that the labor cost for each printed circuit board assembly is calculated based on a substantial database of actual data. Furthermore, calculation of the labor cost is automatic and does not require a significant analysis by the user. With two components, annual volume and mix of component technologies, a user can easily and quickly calculate labor costs for that assembly.

A secondary benefit of incorporating this function via a software platform is the ease by which the historical data can be updated to include recent assembly pricing to increase the precision by which the Manufacturing Labor Cost Estimator generates labor costs.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A method for estimating labor costs associated with producing a printed circuit board assembly comprising the steps of:
   projecting volume for a predetermined period of time for the printed circuit board assembly;
   calculating a cost of conversion at a predetermined percentage of surface mount technology components of the printed circuit board assembly as a function of the volume; and
   generating a cost of conversion for the printed circuit board assembly based on actual percentage of surface mount technology components of the printed circuit board assembly from the cost of conversion at the predetermined percentage to determine the labor costs.

2. A method as described in claim 1 wherein the predetermined percentage is 90% and the calculating step includes the step of inputting the projected annual volume for the printed circuit board assembly into $$\text{Cost of Conversion} = 1.4392 * \text{volume}^{-0.3920}.$$

3. A method as described in claim 2 wherein the generating step includes the step of inserting the actual percentage of surface mount technology components of the printed circuit board assembly and the cost of conversion at the predetermined percentage into $$\$CPPx = \$CPP90 - \left[\$CPP90\left[\frac{SMT\ \%}{90} - 1\right]\right]$$

Where:
$\$CPP90$ is the cost of conversion at 90% SMT components derived from Equation 1 and SMT % is the actual percentage of SMT components for a particular PCBA, entered as a regular number (87 for 87%, not 0.87)

$CPPX is the cost of conversion at X % SMT components.

4. A method for building a printed circuit board assembly comprising the steps of:
   estimating labor costs associated with producing the printed circuit board assembly with a computer as a function of volume of the printed circuit board assembly produced per unit time and percentage of surface mount technology components of the printed circuit board; and
   producing the printed circuit board assembly.

5. An apparatus for estimating labor costs associated with producing a printed circuit board assembly comprising:
   a computer having means for estimating costs associated with a labor portion of manufacturing the printed circuit board assembly; and
   an input device for inputting information for estimating the costs into the computer.

6. An apparatus as described in claim 5 wherein the estimating means includes:
   means for calculating a cost of conversion at a predetermined percentage of surface mount technology components of the printed circuit board assembly; and
   means for generating a cost of conversion for the printed circuit board assembly based on actual percentage of surface mount technology components of the printed circuit board assembly from the cost of conversion at the predetermined percentage.

7. An apparatus as described in claim 6 wherein the predetermined percentage is 90% and the calculating means calculates the cost of conversion at the predetermined percentage based on $$\text{Cost of Conversion} = 1.4392 * \text{volume}^{0.3920}$$

where volume is a projected annual volume for the printed circuit board assembly.

8. An apparatus as described in claim 7 wherein the generating means generates the cost of conversion for the printed circuit board assembly based on $$\$CPPx = \$CPP90 - \left[\$CPP90\left[\frac{SMT\ \%}{90} - 1\right]\right]$$

Where:
$CPP90 is the cost of conversion at 90% SMT components derived from Equation 1 and SMT % is the actual percentage of SMT components for a particular PCBA, entered as a regular number (87 for 87%, not 0.87)

$CPPX is the cost of conversion at X % SMT components.

* * * * *